(12) United States Patent
Mizuno et al.

(10) Patent No.: US 6,991,952 B2
(45) Date of Patent: Jan. 31, 2006

(54) METHOD OF MANUFACTURING SEMICONDUCTOR DEVICE

(75) Inventors: Takashi Mizuno, Miyagi (JP);
Motonobu Takeya, Miyagi (JP);
Takeharu Asano, Kanagawa (JP);
Masao Ikeda, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/613,624

(22) Filed: Jul. 3, 2003

(65) Prior Publication Data
US 2004/0087048 A1 May 6, 2004

(30) Foreign Application Priority Data
Jul. 8, 2002 (JP) .......................... P2002-198783

(51) Int. Cl.
*H01L 21/00* (2006.01)
(52) U.S. Cl. ........................................ 438/26; 438/115
(58) Field of Classification Search ................. 438/26, 438/46, 47, 115
See application file for complete search history.

(56) References Cited

U.S. PATENT DOCUMENTS 5,953,355 A * 9/1999 Kiely et al. .................... 372/43
2002/0043331 A1 * 4/2002 Uemura et al. .......... 156/275.5

* cited by examiner

*Primary Examiner*—Trung Dang
(74) *Attorney, Agent, or Firm*—Sonnenschein, Nath & Rosenthal LLP

(57) ABSTRACT

Provided is a method of manufacturing a semiconductor device, which is adapted to prevent the deposition of a material on a laser light emitting edge, thereby enabling an improvement in longevity characteristics of a laser. A base having a laser chip mounted thereon is irradiated with an energy beam having a shorter wavelength than an oscillation wavelength of the laser chip. Photolysis and oxidation caused by the energy beam cause the removal of an adherent from the overall base or the deterioration thereof, and incidentally, the adherent is derived from an adhesive sheet used to attach the laser chip to the base, or the like. Preferably, laser light or ultraviolet light, for example, is used as the energy beam. Alternatively, the base having the laser chip mounted thereon may be irradiated with plasma so as to remove the adherent utilizing an ion cleaning effect of the plasma. After irradiation, a top is mounted to the base so as to shut off the laser chip from the outside.

10 Claims, 7 Drawing Sheets

METHOD OF MANUFACTURING SEMICONDUCTOR DEVICE

RELATED APPLICATION DATA

The present application claims priority to Japanese Application(s) No(s). P2002-198783 filed Jul. 8, 2002, which application(s) is/are incorporated herein by reference to the extent permitted by law.

BACKGROUND OF THE INVENTION

1. Field of the Invention

The invention relates to a method of manufacturing a semiconductor device including a laser chip, and more particularly to a method of manufacturing a semiconductor device, including a process for cleaning off an adherent such as an organic material.

2. Description of the Related Art

For convenience of operation, an adhesive sheet containing an organic material has been heretofore used to manufacture a semiconductor device using a semiconductor laser. For example, a dicing process for cutting separate laser chips out of a wafer involves cutting the wafer on the front side thereof with a dicing saw after previously sticking an adhesive sheet (a so-called dicing tape) on the back side of the wafer in order to hold the laser chips in such a manner that the divided laser chips do not come apart. The separated laser chips, which are bonded to the adhesive sheet, are mounted on a base (a package) by picking up the laser chips one by one. Even during the mounting, the front and back surfaces of each laser chip are covered with the adhesive sheet in order to protect electrodes and the like.

However, the use of the adhesive sheet having the organic material mixed therein in an assembly process causes the adhesion of an adherent on the manufactured semiconductor device. The organic material contained in the adherent volatilizes into the air, and the volatilized organic material chemically reacts with emitted laser light in an atmosphere. As a result, a photo CVD (photo chemical vapor deposition) effect causes the deposition of a material such as a silicon (Si) compound, carbon (C), or an organic material on a laser light emitting edge having the highest optical density. This phenomenon is noticeable, particularly when a nitride semiconductor laser having an oscillation wavelength in or near an ultraviolet region is used in the semiconductor device.

The deposited material causes not only interference with output of laser light but also a change in reflectance of a laser edge. Consequently, an operating current abnormally varies during the driving of a laser, and this may lead to a considerable deterioration in longevity characteristics of the laser.

SUMMARY OF THE INVENTION

The invention is designed to overcome the foregoing problems. It is an object of the invention to provide a method of manufacturing a semiconductor device, which is adapted to prevent the deposition of a material on a laser light emitting edge during the operation of a laser, thereby enabling an improvement in longevity characteristics of the laser.

According to a first aspect of the invention, a method of manufacturing a semiconductor device including a laser chip and a base having the laser chip mounted thereon includes the step of irradiating the base with an energy beam having a shorter wavelength than an oscillation wavelength of the laser chip.

According to a second aspect of the invention, a method of manufacturing a semiconductor device including a laser chip and a base having the laser chip mounted thereon includes the step of irradiating the base with plasma.

In the method of manufacturing a semiconductor device according to the first aspect of the invention, the base having the laser chip mounted thereon is irradiated with the energy beam having a shorter wavelength than the oscillation wavelength of the laser chip, and this irradiation causes the removal or deterioration of an adherent deposited on a substrate of the laser chip, the electrodes thereof, the edge thereof, or the like. Moreover, the overall base is irradiated with the energy beam, and therefore this allows exterminating the adherent from the overall system of the base, thereby completely breaking off contact of the laser chip with a foreign material on the edge. Accordingly, this arrangement permits preventing the deposition of a material on a laser light emitting edge due to a photo CVD effect during the operation of the laser.

In the method of manufacturing a semiconductor device according to the second aspect of the invention, the base having the laser chip mounted thereon is irradiated with the plasma, and thus an ion cleaning effect causes the removal of the adherent deposited on the substrate of the laser chip, the electrodes thereof, the edge thereof, or the like. Moreover, the overall base is irradiated with the plasma, and therefore this allows exterminating the adherent from the overall system of the base, thereby completely breaking off contact of the laser chip with the foreign material on the edge. Accordingly, this arrangement permits preventing the deposition of a material on the laser light emitting edge due to the photo CVD effect during the operation of the laser.

Other and further objects, features and advantages of the invention will appear more fully from the following description.

DETAILED DESCRIPTION OF THE PREFERRED EMBODIMENTS

Embodiments of the invention will be described in detail below with reference to the drawings.

[First Embodiment]

Figure 1:
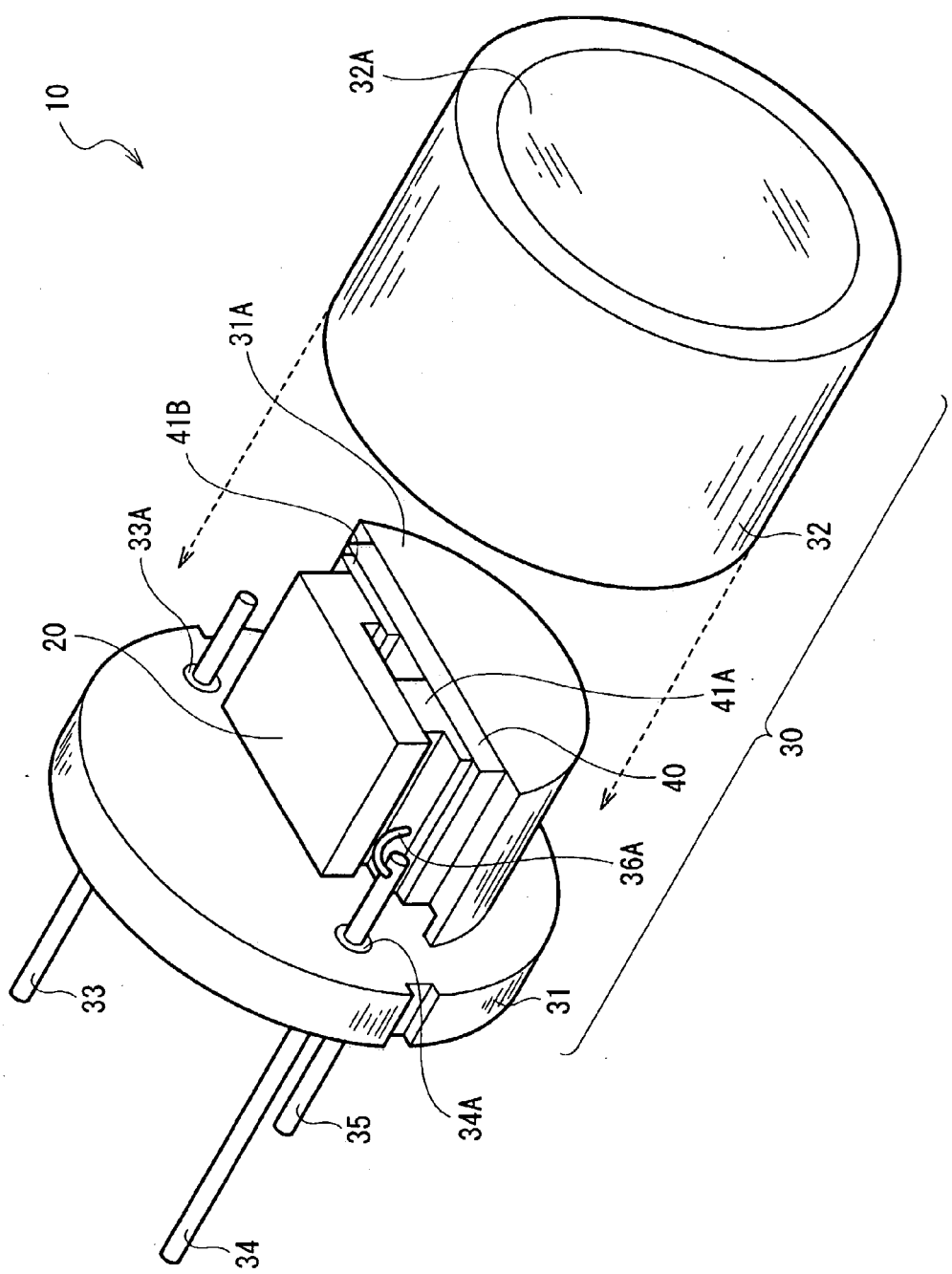
FIG. 1 is a perspective view showing a general configuration of a semiconductor laser which is a semiconductor device according to a first embodiment of the invention.
Figure 2:
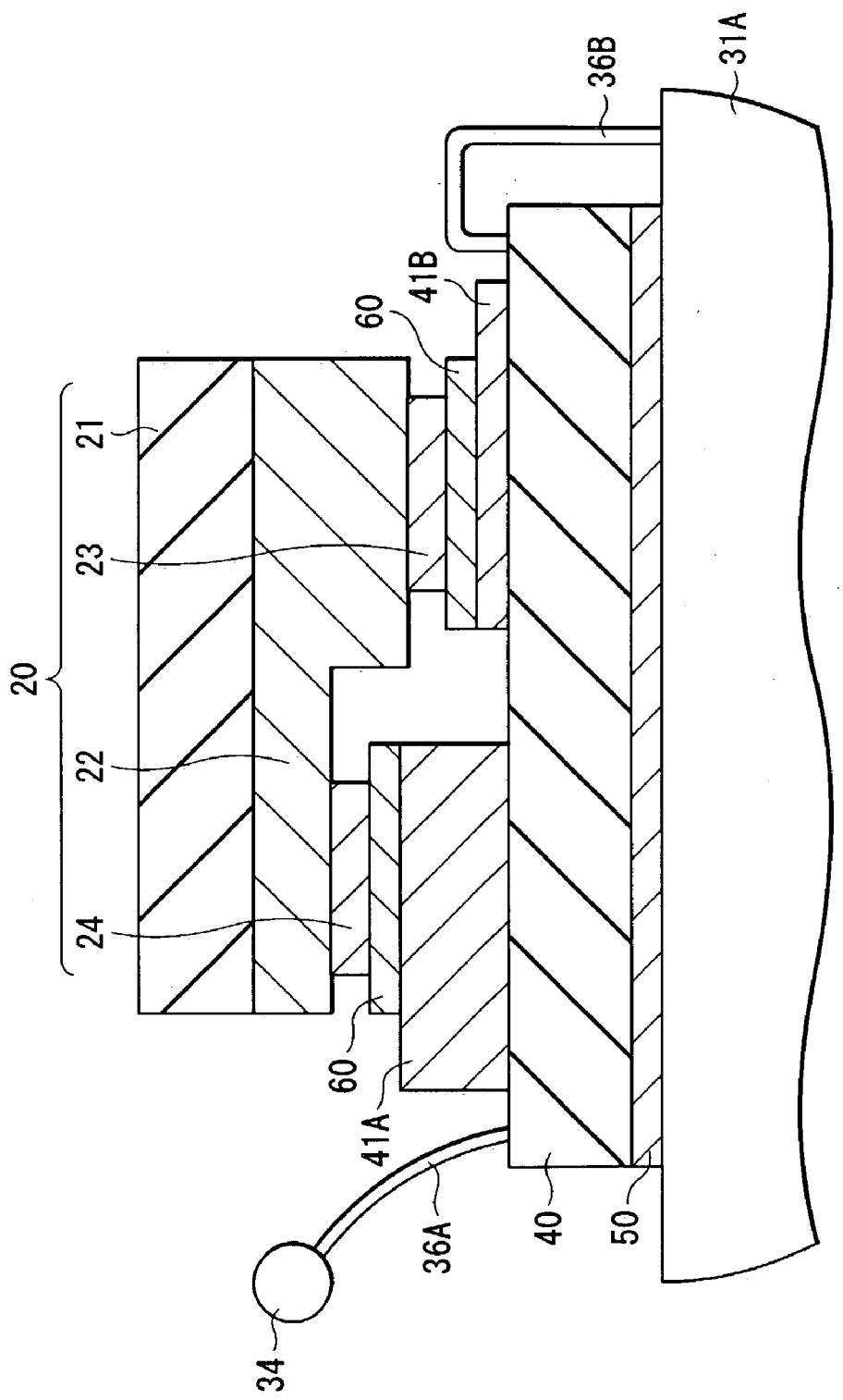
FIG. 2 is a cross-sectional view showing a configuration of a laser chip shown in FIG. 1.

FIG. 1 shows a general configuration of a semiconductor laser 10 which is a semiconductor device according to a first embodiment of the invention. FIG. 2 shows a cross-sectional configuration of a laser chip 20 included as a structural component of the semiconductor laser 10.

For instance, the semiconductor laser 10 includes the laser chip 20 mounted to a can-type package 30 of, for example, 5.6 φ formed of a disc-shaped base 31 and a top 32 in the shape of a hollow cylinder. The laser chip 20 has a nitride semiconductor layer 22, and has an oscillation wavelength in an ultraviolet region or a visible short-wavelength region of 550 nm or less. In the first embodiment, the laser chip 20 has an oscillation wavelength of close to 400 nm, for example.

The base 31 is made of metal such as copper or iron and is integrally formed with a heat sink 31A. The top 32 is opened at one end and closed at the other end. In the closed end of the top 32, provided is an outlet 32A for letting a laser beam emitted from the laser chip 20 contained inside out of the semiconductor laser 10. The top 32 is made of metal such as copper or iron, and the outlet 32A is made of a material capable of transmitting the laser beam emitted from the laser chip 20, such as glass or plastic.

The base 31 includes a pair of pins 33 and 34 extending in a direction perpendicular to a surface of the base 31. The pins 33 and 34 are made of metal such as copper or iron, and the surfaces thereof are coated with a thin film made of gold (Au) or the like. Insulating rings 33A and 34A made of glass or the like are provided between the base 31 and the pins 33 and 34, respectively, and thus the base 31 is electrically insulated from the pins 33 and 34. One end of a wire 36A made of gold of, for example, 20 μm in thickness is bonded to the pin 34. The other end of the wire 36A is bonded to a wiring 41A, and thus the pin 34 is electrically connected to the wiring 41A. The base 31 further includes a pin 35 electrically connected to the base 31 and the heat sink 31A.

The heat sink 31A is made of metal such as copper or iron. The heat sink 31A is electrically connected to a power supply (not shown) of the semiconductor laser 10 and serves to diffuse heat generated by the semiconductor laser 10.

A submount 40 made of, for example, aluminum nitride is provided on the heat sink 31A with an adhesive layer 50 in between. The adhesive layer 50 has a stacked structure comprising, for example, a titanium layer, a silver layer, and a tin layer, which are stacked in sequence.

The laser chip 20 is provided on the submount 40 on the side opposite to the heat sink 31A with the wirings 41A and 41B in between.

The laser chip 20 includes a substrate 21 made of, for example, sapphire (α-Al$_2$O$_3$). The nitride semiconductor layer 22 including an active layer is formed on a c-surface of the substrate 21. A p-side electrode 23 and an n-side electrode 24, which are formed through the process that involves stacking a plurality of metal layers in sequence and then alloying the metal layers by heat treatment, are formed on the nitride semiconductor layer 22.

Incidentally, a nitride semiconductor herein refers to a gallium nitride compound containing gallium (Ga) and nitrogen (N), such as gallium nitride (GaN), an aluminum-gallium nitride (AlGaN) mixed crystal, or an aluminum-gallium-indium nitride (AlGaInN) mixed crystal. As needed, these contain an n-type impurity made of group IV and VI elements such as silicon (Si), germanium (Ge), oxygen (O) and selenium (Se), or a p-type impurity made of group II and IV elements such as magnesium (Mg), zinc (Zn) and carbon (C).

The laser chip 20 is located on the submount 40 with the wirings 41A and 41B and an adhesive layer 60 in between in such a manner that the laser chip 20 is faced with the submount 40 on the side of the p-side electrode 23 and the n-side electrode 24. The adhesive layer 60 has a stacked structure comprising, for example, a titanium layer, a silver layer, and a tin layer, which are stacked in sequence.

Each of the wirings 41A and 41B has a stacked structure comprising, for example, titanium (Ti) and aluminum (Al), which are stacked in this sequence with respect to the submount 40. The wiring 41B is located under the p-side electrode 23 of the laser chip 20, and the wiring 41A is located under the n-side electrode 24 thereof. One end of a wire 36B made of gold of, for example, 20 μm in thickness is bonded to the wiring 41B. The other end of the wire 36B is bonded to the heat sink 31A, and thus the wiring 41B is connected to the power supply (not shown) through the heat sink 31A.

The semiconductor laser 10 having the above-described configuration can be manufactured in the following manner.

Figure 3:
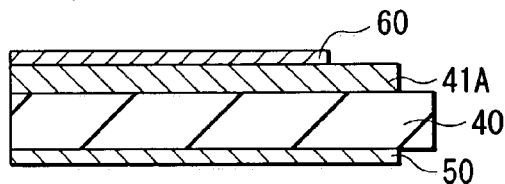
FIG. 3 is a cross-sectional view showing one step of a method of manufacturing the semiconductor laser shown in FIG. 1.

FIGS. 3 to 10 show a process for manufacturing the semiconductor laser 10. FIGS. 3 to 5 and FIGS. 8 and 9 show a cross-sectional structure including the wiring 41A and the n-side electrode 24, taken along a direction perpendicular to the drawings. Firstly, the submount 40 made of, for example, aluminum nitride is prepared as shown in FIG. 3. The wirings 41A and 41B, the adhesive layer 60 and the adhesive layer 50 are formed on both surfaces of the submount 40 by vacuum evaporation, for example.

Figure 4:
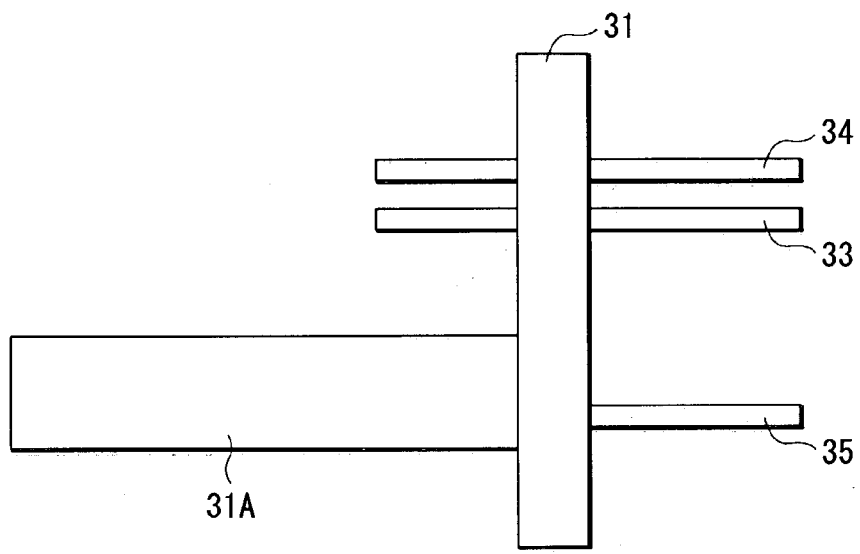
FIG. 4 is a cross-sectional view showing a step following the step of FIG. 3.
Figure 5:
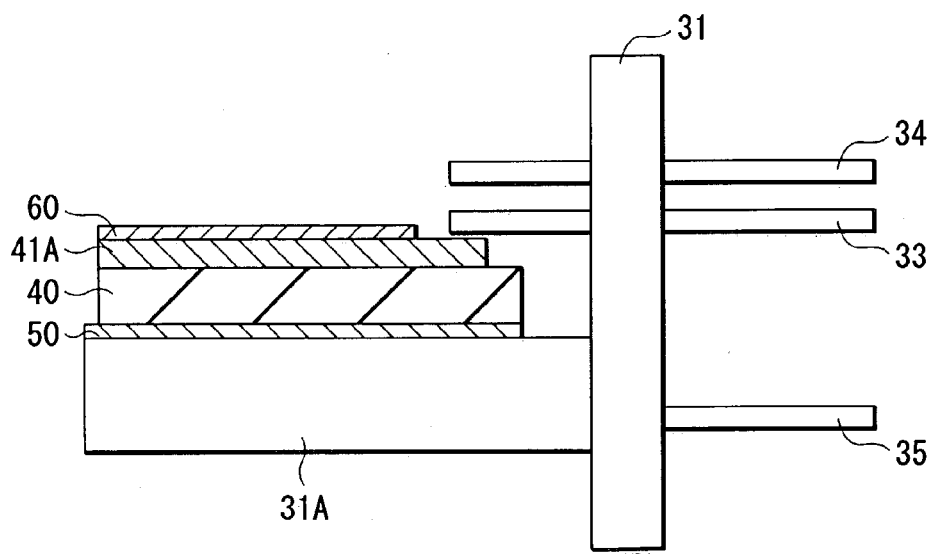
FIG. 5 is a cross-sectional view showing a step following the step of FIG. 4.

Moreover, the base 31 provided with the pins 33, 34 and 35 is prepared as shown in FIG. 4. Then, the submount 40 is placed on the heat sink 31A integrally formed with the base 31 and is aligned with accuracy, as shown in FIG. 5.

Figure 6:
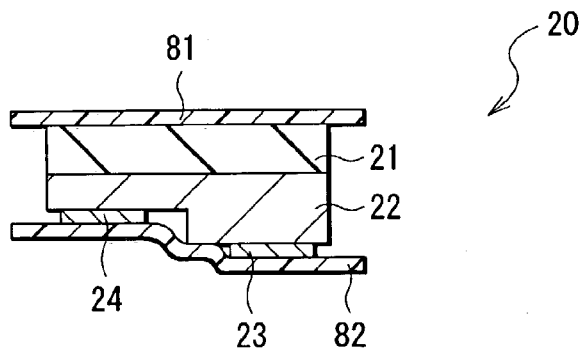
FIG. 6 is a cross-sectional view showing a step following the step of FIG. 5.

Then, the laser chip 20 including the nitride semiconductor layer 22, the p-side electrode 23, and the n-side electrode 24, which are formed therein, is prepared on one surface of the substrate 21 as shown in FIG. 6. In this case, a separate sheet 81 is stuck to the substrate 21 of the laser chip 20. Moreover, an adhesive sheet 82 is stuck to the p-side electrode 23 and the n-side electrode 24 of the laser chip 20. The separate sheet 81 and the adhesive sheet 82 protect the laser chip 20 during the storage and picking-up of the laser chip 20.

Figure 7:
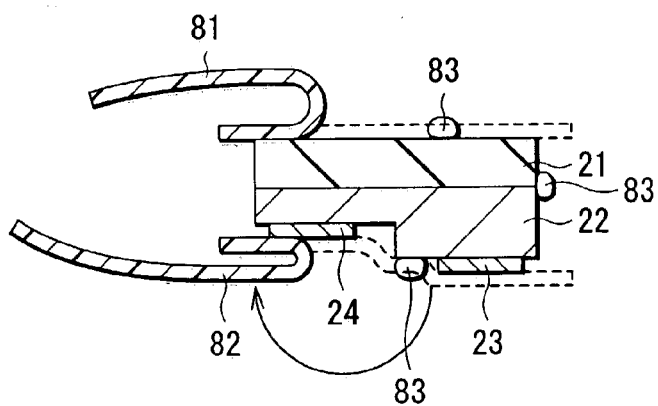
FIG. 7 is a cross-sectional view showing a step following the step of FIG. 6.

The separate sheet 81 is peeled off from the substrate 21 of the laser chip 20 as shown in FIG. 7. In this case, an adherent 83 remains on the substrate 21 or an edge of the laser chip 20 after the peeling of the separate sheet 81.

Then, the adhesive sheet 82 is peeled off from the p-side electrode 23 and the n-side electrode 24 of the laser chip 20 as shown in FIG. 7. In this case, the adherent 83 remains on the p-side electrode 23 and the n-side electrode 24 or the edge of the laser chip 20 after the peeling of the adhesive sheet 82.

Figure 8:
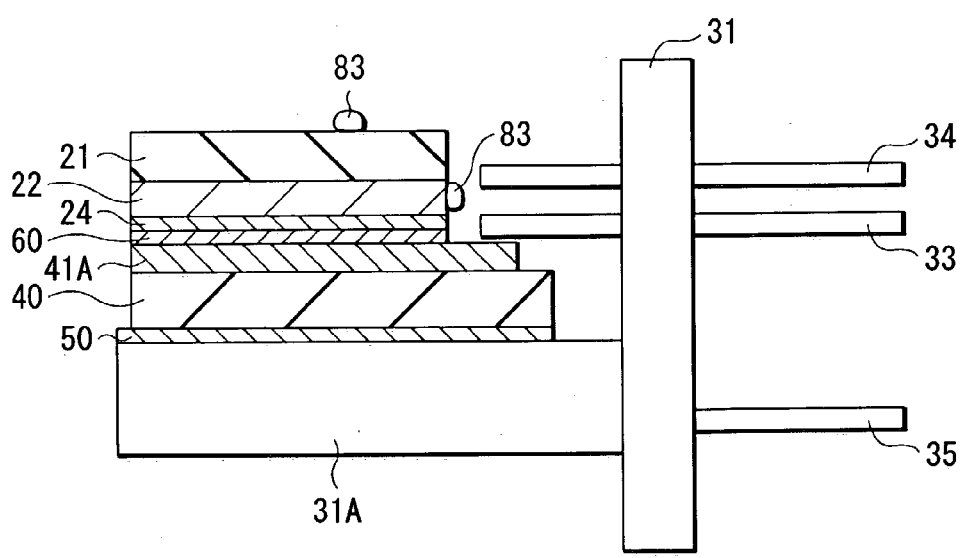
FIG. 8 is a cross-sectional view showing a step following the step of FIG. 7.

After that, as shown in FIG. 8, the laser chip 20 on the side of the p-side electrode 23 and the n-side electrode 24 is accurately aligned with the submount 40 on the side of the adhesive layer 60, and thus the laser chip 20 is placed on the submount 40. In this case, the thickness of the wiring 41A is such that a difference in level between the p-side electrode 23 and the n-side electrode 24 of the laser chip 20 is adjusted, and therefore the laser chip 20 can be placed horizontal to the submount 40 by positioning the wirings 41A and 41B under the n-side electrode 24 and the p-side electrode 23, respectively.

Then, the laser chip 20 is loaded on the side of the substrate 21 by means of a collet apparatus (not shown), and heat treatment takes place on the side of the heat sink 31A by using, for example, a heating device, whereby the laser chip 20, the submount 40 and the heat sink 31A are bonded.

Figure 9:
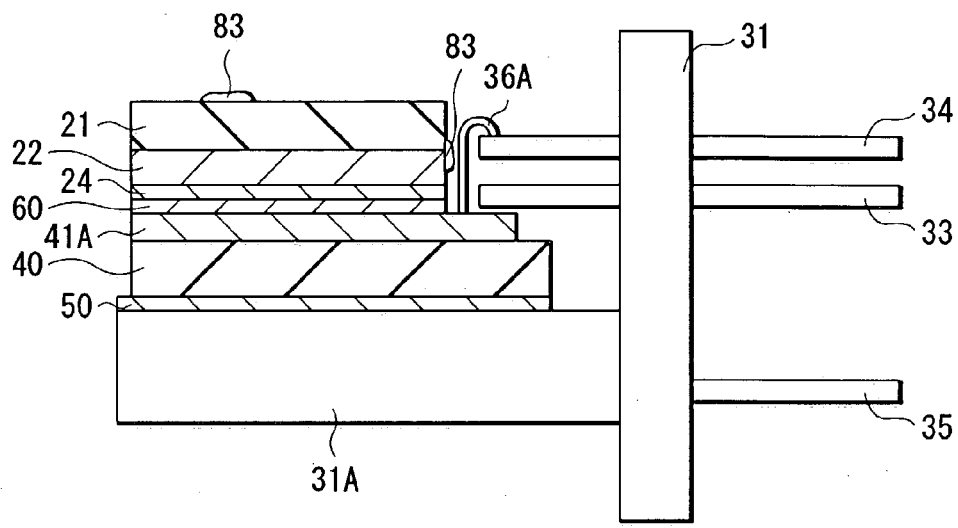
FIG. 9 is a cross-sectional view showing a step following the step of FIG. 8.

Then, as shown in FIG. 9, the wire 36A is bonded between the wiring 41A and the pin 34, and the wire 36B (see FIG. 2) is bonded between the wiring 41B and the heat sink 31A. Thus, the laser chip 20 is mounted on the heat sink 31A of the base 31 as shown in FIG. 2.

Figure 10:
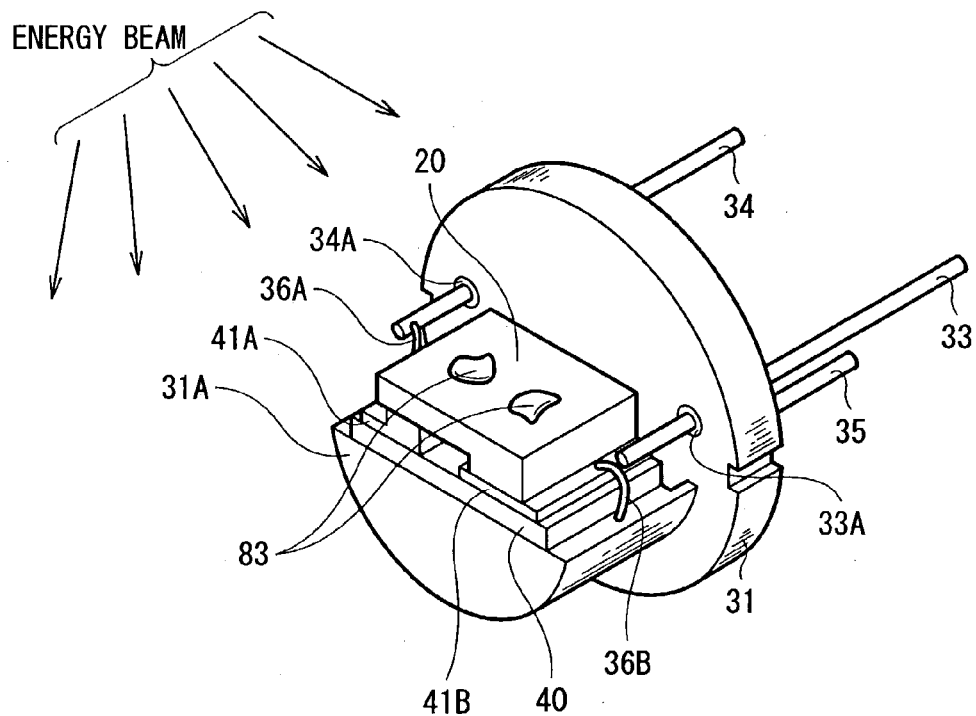
FIG. 10 is a cross-sectional view showing a step following the step of FIG. 9.

After that, as shown in FIG. 10, the base 31 having the laser chip 20 mounted thereon is irradiated with an energy beam EB having a shorter wavelength than the oscillation wavelength of the laser chip 20. Photolysis or oxidation caused by the energy beam EB removes or deteriorates the adherent 83 deposited on the substrate 21 of the laser chip 20, the p-side electrode 23 and the n-side electrode 24, edge of the laser chip 20, or the like. The reason why the overall base 31 is irradiated with the energy beam EB after the mounting of the laser chip 20 on the base 31 as mentioned above is as follows. When the laser chip 20 alone is irradiated with the energy beam EB so as to remove the adherent 83, a material is deposited on a laser light emitting edge during the operation of the semiconductor laser 10 if the adherent 83 remains anywhere in a system of the base 31 including the laser chip 20 and the heat sink 31A, and it is therefore necessary to exterminate the adherent 83 from the overall system and thus completely break off contact of the laser chip 20 with a foreign material on the edge. This arrangement allows preventing the deposition of a material on the laser light emitting edge due to a photo CVD effect during the operation of the semiconductor laser 10, thereby improving longevity characteristics of the semiconductor laser 10.

The energy beam EB is not limited as long as the energy beam EB has a shorter wavelength than the oscillation wavelength of the laser chip 20. The reason is that irradiation with the energy beam having a shorter wavelength than the oscillation wavelength of the laser chip 20 does not cause another chemical reaction between a component of the adherent 83 and laser light due to light emitted from the semiconductor laser 10 itself during the operation of the semiconductor laser 10. Preferably, laser light or ultraviolet light, for example, is used as the energy beam EB because of facilitating operation. More preferably, laser light is used because the laser light can improve productivity and be incorporated into an assembly apparatus because of having high optical density and a short processing time.

When laser light is used, the light source and wavelength of the laser light are not particularly limited as long as the laser light has a shorter wavelength than the oscillation wavelength of the laser chip 20. Preferably, the laser light has the shortest possible wavelength within the above-mentioned range because shorter wavelength yields greater cleaning effect. For example, it is preferable to use a gallium nitride laser having a wavelength of close to 400 nm, an XeF laser having a wavelength of 351 nm, an XeCl laser having a wavelength of 308 nm, a KrF laser having a wavelength of 248 nm, an ArF laser having a wavelength of about 193 nm, or the like.

When ultraviolet light is used, the light source and wavelength of the ultraviolet light are not particularly limited as long as the ultraviolet light has a shorter wavelength than the oscillation wavelength of the laser chip 20.

When either of laser light and ultraviolet light is used, a processing atmosphere is not limited and can be set so that processing takes place in, for example, the air, a vacuum, an atmosphere of nitrogen ($N_2$), an atmosphere of oxygen ($O_2$), or the like. A processing temperature and a processing time can be set to, for example, 80 degrees and about 30 minutes, respectively.

Finally, the top 32 separately formed is mounted to the base 31 in, for example, an atmosphere of dry nitrogen, and thus the laser chip 20 contained inside is shut off from the outside. This makes it possible to prevent the entry of an external material capable of reacting with laser light during the operation of the semiconductor laser 10, after irradiation with the energy beam EB to remove the adherent 83 from the overall base 31 including the laser chip 20 and the heat sink 31A or to deteriorate the adherent 83. Therefore, the effect of irradiation with the energy beam EB can be further enhanced. Preferably, the top 32 is mounted as soon as possible after irradiation with the energy beam EB, or more preferably the top 32 is mounted immediately after irradiation. The reason is that with the passage of time, a material capable of reacting with laser light may come into contact with the laser chip 20 or the base 31. The semiconductor laser 10 shown in FIG. 1 is completed through the above-described process.

As described above, in the first embodiment, the base 31 having the laser chip 20 mounted thereon is irradiated with the energy beam EB having a shorter wavelength than the oscillation wavelength of the semiconductor laser 10, and therefore photolysis and oxidation cause the removal or deterioration of the adherent 83 deposited on the substrate 21, the p-side electrode 23 and the n-side electrode 24, the edge of the laser chip 20, or the like. Moreover, the overall base 31 is irradiated with the energy beam EB after the mounting of the laser chip 20 on the base 31, and therefore it is possible to exterminate the adherent 83 from the overall system of the base 31 including the laser chip 20 and the heat sink 31A and thus completely break off contact of the laser chip 20 with a foreign material on the edge. Accordingly, this arrangement allows preventing the occurrence of chemical reaction between the component of the adherent 83 and laser light during the operation of the semiconductor laser 10, thereby preventing the deposition of a material on the laser light emitting edge due to the photo CVD effect. This allows preventing the absorption of laser light by the deposited material and variation in reflectance of the laser light emitting edge, thus avoiding abnormal variation in an operating current of the semiconductor laser 10, and thereby achieving an improvement in the longevity characteristics of the semiconductor laser 10.

Moreover, the top 32 is mounted to the base 31 after irradiation with the energy beam EB so that the laser chip 20 is shut off from the outside, and therefore it is possible to prevent the entry of an external material capable of reacting with laser light during the operation of the semiconductor laser 10 after irradiation with the energy beam EB to remove or deteriorate the adherent 83. Accordingly, the effect of irradiation with the energy beam EB can be further enhanced.

[Second Embodiment]

Next, the description is given with regard to a process for manufacturing a semiconductor laser which is a semiconductor device according to a second embodiment of the invention. In the second embodiment, the base 31 having the laser chip 20 mounted thereon is irradiated with plasma so as to remove the adherent 83.

Firstly, the laser chip 20 is mounted on the heat sink 31A integrally formed with the base 31 with the submount 40 in between after the peeling of the separate sheet 81 and the adhesive sheet 82 from the laser chip 20, as in the case of the first embodiment described with reference to FIGS. 3 to 9. In this case, the adherent 83 remains on the substrate 21 or the edge of the laser chip 20 after the peeling of the separate sheet 81.

After that, the base 31 having the laser chip 20 mounted thereon is irradiated with plasma. Thus, an ion cleaning effect causes the removal of the adherent 83 remaining on the substrate 21 or the edge of the laser chip 20. The reason why the overall base 31 is irradiated with the plasma after the mounting of the laser chip 20 on the base 31 as mentioned above is as follows. When the laser chip 20 alone is irradiated with the plasma so as to remove the adherent 83, a material is deposited on the laser light emitting edge during the operation of the semiconductor laser 10 if the adherent 83 remains anywhere in the system of the base 31 including the laser chip 20 and the heat sink 31A, and it is therefore necessary to exterminate the adherent 83 from the overall system and thus completely break off contact of the laser chip 20 with a foreign material on the edge. This arrangement allows preventing the deposition of a material on the laser light emitting edge due to the photo CVD effect during the operation of the semiconductor laser 10, thereby improving the longevity characteristics of the semiconductor laser 10.

Inert plasma such as argon (Ar) or $N_2$ can be used as the plasma. Irradiation with the plasma can take place for, for instance, about 10 minutes using, for example, ECR sputtering. During irradiation, temperature can lie between ordinary temperature and about 200 degrees.

Finally, the top 32 separately formed is mounted to the base 31 in, for example, an atmosphere of dry nitrogen, and thus the laser chip 20 contained inside is shut off from the outside. The semiconductor laser 10 is completed through the above-described process.

As described above, in the second embodiment, the base 31 having the laser chip 20 mounted thereon is irradiated with the plasma, and therefore the ion cleaning effect causes the removal of the adherent 83 deposited on the substrate 21, the p-side electrode 23 and the n-side electrode 24, the edge of the laser chip 20, or the like. Moreover, the overall base 31 is irradiated with the plasma after the mounting of the laser chip 20 on the base 31, and therefore it is possible to exterminate the adherent 83 from the overall system of the base 31 including the laser chip 20 and the heat sink 31A and thus completely break off contact of the laser chip 20 with a foreign material on the edge. Accordingly, this arrangement allows preventing the occurrence of chemical reaction between the component of the adherent 83 and laser light during the operation of the semiconductor laser 10, thereby preventing the deposition of a material on the laser light emitting edge due to the photo CVD effect. This allows preventing the absorption of laser light by the deposited material and variation in the reflectance of the laser light emitting edge, thus avoiding abnormal variation in the operating current of the semiconductor laser 10, and thereby achieving an improvement in the longevity characteristics of the semiconductor laser 10.

[Third Embodiment]

Next, the description is given with regard to a process for manufacturing a semiconductor laser which is a semiconductor device according to a third embodiment of the invention. In the third embodiment, the base 31 having the laser chip 20 mounted thereon is irradiated with plasma in an atmosphere of oxygen so as to remove the adherent 83.

Firstly, the laser chip 20 is mounted on the heat sink 31A integrally formed with the base 31 with the submount 40 in between after the peeling of the separate sheet 81 and the adhesive sheet 82 from the laser chip 20, as in the case of the first embodiment described with reference to FIGS. 3 to 9. In this case, the adherent 83 remains on the substrate 21, the edge of the laser chip 20, or the like after the peeling of the separate sheet 81.

After that, the base 31 having the laser chip 20 mounted thereon is irradiated with plasma in an atmosphere of oxygen. This makes it possible to generate a large amount of oxygen radical and ozone having a strong oxidation. Therefore, oxidation by the oxygen radical or the ozone is added to the ion cleaning effect of the plasma, which can further ensure that the adherent 83 is removed.

Irradiation with the plasma can take place for, for instance, about 10 minutes using, for example, ECR sputtering. During irradiation, temperature can lie between ordinary temperature and about 200 degrees.

Finally, the top 32 separately formed is mounted to the base 31 in, for example, an atmosphere of dry nitrogen, and thus the laser chip 20 contained inside is shut off from the outside. The semiconductor laser 10 is completed through the above-described process.

As described above, in the third embodiment, the base 31 having the laser chip 20 mounted thereon is irradiated with plasma in an atmosphere of oxygen, and thus it is possible to generate a large amount of oxygen radical and ozone having a strong oxidation. Therefore, oxidation by the oxygen radical or the ozone is added to the ion cleaning effect of the plasma, which can further ensure that the adherent 83 is removed.

EXAMPLE

Furthermore, a specific example of the invention will be described in detail with reference to FIGS. 1 and 2. The example corresponds to the above-mentioned first embodiment in which ultraviolet light is used as the energy beam EB.

The semiconductor laser 10 having an oscillation wavelength of close to 400 nm was manufactured in the following manner. Firstly, the submount 40 made of aluminum nitride was prepared, and the wirings 41A and 41B, the adhesive layer 60 and the adhesive layer 50 were formed on both surfaces of the submount 40 by vacuum evaporation (see FIG. 3).

Moreover, the base 31 provided with the pins 33, 34 and 35 was prepared (see FIG. 4). Then, the submount 40 was placed on the heat sink 31A integrally formed with the base 31 and was aligned with accuracy (see FIG. 5).

Then, the laser chip 20 comprising the nitride semiconductor layer 22 including the active layer, the p-side electrode 23, and the n-side electrode 24, which are formed therein, was prepared on one surface of the substrate 21. The separate sheet 81 was stuck to the substrate 21 of the laser chip 20. Moreover, the adhesive sheet 82 was stuck to the p-side electrode 23 and the n-side electrode 24 of the laser chip 20 (see FIG. 6).

The separate sheet 81 was peeled off from the substrate 21 of the laser chip 20. In this case, the adherent 83 containing an organic material remained on the substrate 21 or the edge of the laser chip 20 after the peeling of the separate sheet 81 (see FIG. 7).

Moreover, the adhesive sheet 82 was peeled off from the p-side electrode 23 and the n-side electrode 24 of the laser chip 20 (see FIG. 7).

After that, the laser chip 20 on the side of the p-side electrode 23 and the n-side electrode 24 was accurately aligned with the submount 40 on the side of the adhesive layer 60, and thus the laser chip 20 was horizontally placed on the submount 40 (see FIG. 8). Then, the laser chip 20 was loaded on the side of the substrate 21 by means of a collet apparatus, and heat treatment took place on the side of the heat sink 31A by using a heating apparatus, whereby the laser chip 20, the submount 40 and the heat sink 31A were bonded.

Then, the wire 36A was bonded between the wiring 41A and the pin 34, and the wire 36B was bonded between the wiring 41B and the heat sink 31A (see FIG. 9). Thus, the laser chip 20 was mounted on the base 31 (see FIG. 2).

After that, the base 31 having the laser chip 20 mounted thereon was irradiated with the energy beam EB having a shorter wavelength than a wavelength of close to 400 nm which was the oscillation wavelength of the laser chip 20 (see FIG. 10). Ultraviolet light having wavelengths of 254 nm and 185 nm was used as the energy beam EB, and irradiation took place at a temperature of 80 degrees for about 30 minutes using a UV stripper.

Finally, the top 32 separately formed was mounted to the base 31 in an atmosphere of dry nitrogen, and thus the laser chip 20 contained inside was shut off from the outside. The semiconductor laser 10 including the laser chip 20 mounted to the can-type package 30 of 5.6 φ formed of the base 31 and the top 32 was completed through the above-described process (see FIG. 1).

Figure 11A:
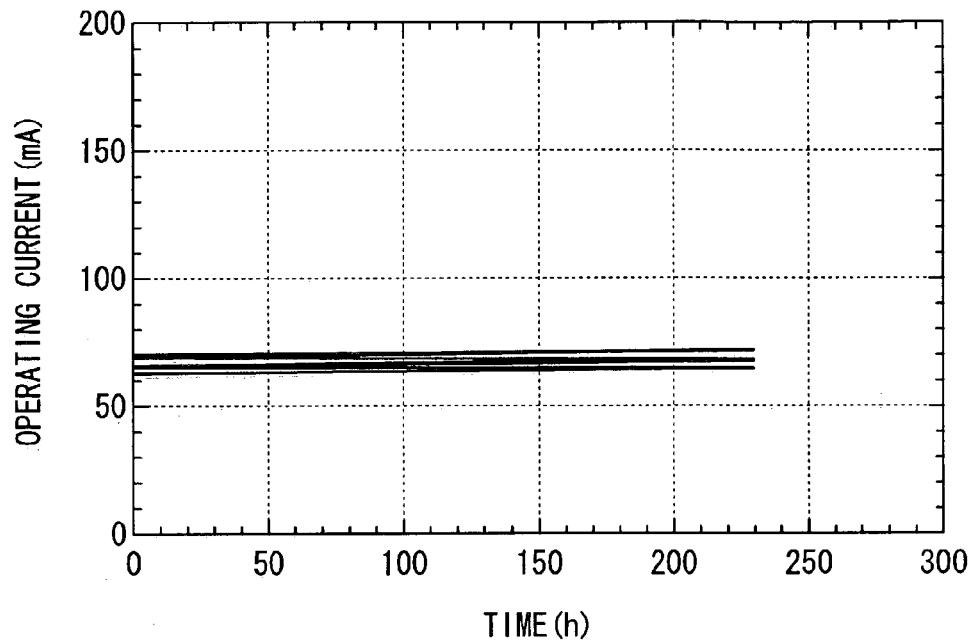
FIGS. 11A and 11B are plots showing an aging curve of a semiconductor laser according to an example of the invention relative to that of a comparative example.
Figure 12A:
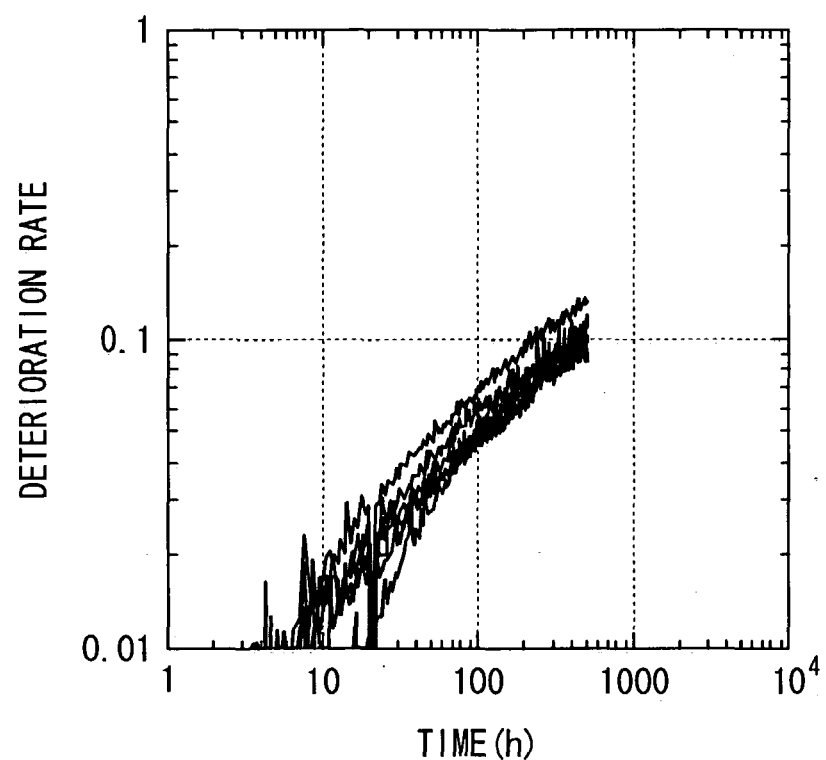
FIGS. 12A and 12B are plots showing a deterioration rate of the semiconductor laser according to the example of the invention relative to that of the comparative example.
Figure 12B:
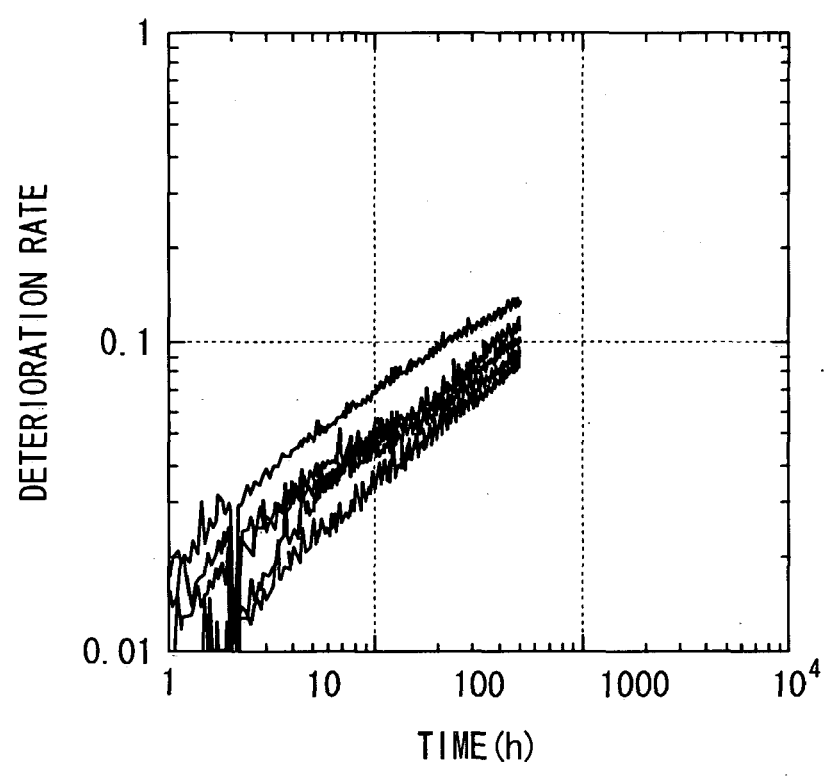

Five semiconductor lasers 10 were manufactured, and a characteristic test was carried out on the resulting semiconductor lasers 10 so as to obtain aging characteristics and a deterioration rate of each semiconductor laser 10. In this case, aging test conditions were as follows: an environmental temperature of 60 degrees, a light output of 30 mW, a CW (continuous wave), and APC (automatic power control) driving. The obtained results are shown in FIGS. 11A and 12A. Incidentally, the deterioration rate indicated by the vertical axis of FIGS. 12A and 12B is expressed as the ratio of an operating current value measured during the aging test to an operating current value measured at the start time of the aging test, assuming that the value is 1 at the start time.

Figure 11B:
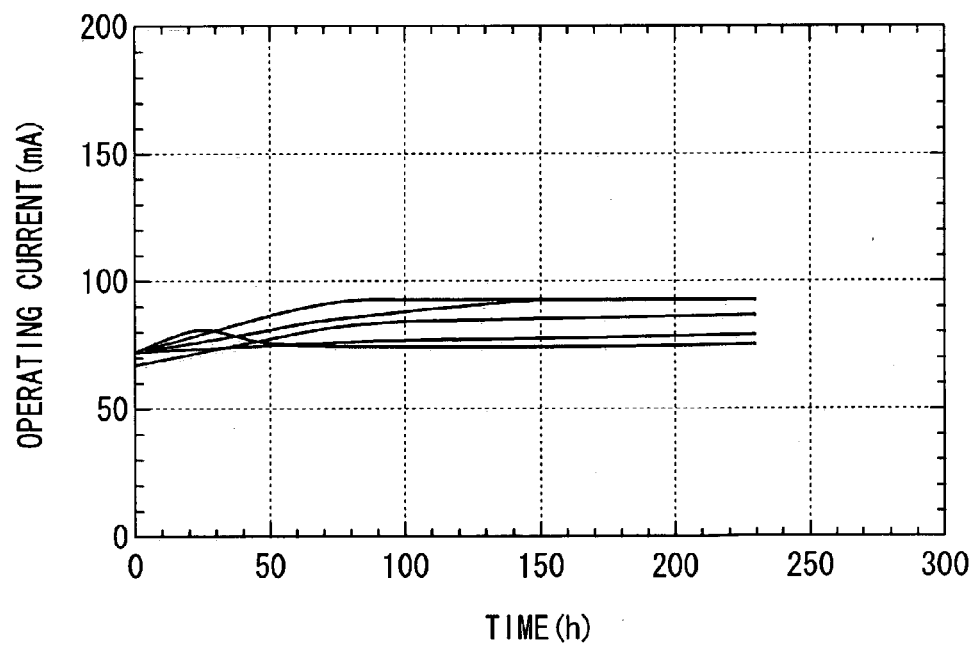

As a comparative example of the example of the invention, five semiconductor lasers were manufactured in the same manner as the example of the invention except that the top 32 was mounted to the base 31 without irradiation with the energy beam EB after the mounting of the laser chip 20 on the base 31. The characteristic test was carried out on the semiconductor lasers of the comparative example in the same manner as the example of the invention so as to measure aging characteristics and a deterioration rate of each semiconductor laser. The obtained results are shown in FIGS. 11B and 12B.

As shown in FIGS. 11A and 11B and FIGS. 12A and 12B, each of the semiconductor lasers 10 irradiated with the energy beam EB according to the example of the invention had an operating current kept nearly at an initial value regardless of the lapse of time. Moreover, there was little variation in both the aging characteristics and the deterioration rate among the semiconductor lasers 10, and thus the semiconductor lasers 10 had nearly identical characteristics.

On the other hand, each of the semiconductor lasers subjected to no irradiation with the energy beam EB according to the comparative example had an operating current which exhibited the periodic abnormal variation that the operating current increased and then decreased in cycles. Moreover, the semiconductor lasers of the comparative example exhibited greater variation in the aging characteristics and the deterioration rate than the semiconductor lasers 10 of the example of the invention exhibited. More specifically, it was found that the irradiation of the base 31 having the laser chip 20 mounted thereon with the energy beam EB having a shorter wavelength than the oscillation wavelength of the laser chip 20 allowed preventing the absorption of laser light by a material deposited on the laser light emitting edge due to the photo CVD effect and variation in the reflectance of the laser light emitting edge during the operation of the semiconductor laser 10, thus avoiding abnormal variation in the operating current, and thus improving the longevity characteristics of the semiconductor laser 10.

Although the invention is described above by referring to the embodiments, the invention is not limited to the above-mentioned embodiments and various modifications of the invention are possible. For example, silicon (Si) or diamond (C) may be used as the submount 40 although aluminum nitride is used as the submount 40 in the above-mentioned embodiments. Although the wirings 41A and 41B are made of titanium and aluminum in the above-mentioned embodiments, aluminum may be replaced by gold. Although the structure, material and thickness of each layer are described in conjunction with the specific examples thereof in the above-mentioned embodiments, other layers may be provided or other materials may be used. The thickness may be appropriately changed or adjusted.

Although the description is given with regard to the above-mentioned embodiments in which a sapphire substrate is used as the substrate 21 of the laser chip 20 and the p-side electrode 23 and the n-side electrode 24 are provided on one surface of the substrate 21, the invention may be applied to the case where a gallium nitride substrate is used as the substrate and the p-side electrode and the n-side electrode are located on the other surface of the substrate.

Although the description is given with regard to the semiconductor laser 10 of the above-mentioned embodiments including one laser chip 20 mounted on the base 31 and thus having a single oscillation wavelength, the invention may be applied to a multi-wavelength laser having two oscillation wavelengths or more. In this case, the energy beam EB having a shorter wavelength than all the oscillation wavelengths of the laser is used.

Although the description is given with regard to the above-mentioned embodiments in which the can-type package 30 formed of the base 31 and the top 32 is used, the shape of the base 31 is not particularly limited to the can-type package, and the base 31 may be of a carrier type, for example.

A semiconductor device other than the laser chip 20, such as a photo-detector, may be mounted on the base 31.

Although the description is given with regard to the above-mentioned embodiments by taking the semiconductor laser as an example of the semiconductor device, the invention may be applied to other semiconductor devices including the laser chip, such as a laser coupler and an optical disk pickup apparatus.

As described above, according to the method of manufacturing a semiconductor device of the invention, the base having the laser chip mounted thereon is irradiated with the energy beam having a shorter wavelength than the oscillation wavelength of the laser chip, and therefore photolysis and oxidation cause the removal or deterioration of the adherent deposited on the substrate of the laser chip, the electrodes thereof, the edge thereof, or the like. Moreover, the overall base is irradiated with the energy beam after the mounting of the laser chip on the base, and therefore it is possible to exterminate the adherent from the overall system of the base including the laser chip and the heat sink and thus completely break off contact of the laser chip with the foreign material on the edge. Accordingly, this arrangement allows preventing the occurrence of chemical reaction between the component of the adherent and laser light during the operation of the semiconductor laser, thereby preventing the deposition of a material on the laser light emitting edge due to the photo CVD effect. This allows preventing the absorption of laser light by the deposited material and variation in the reflectance of the laser light emitting edge, thus avoiding abnormal variation in the operating current of the semiconductor laser, and thereby achieving an improvement in the longevity characteristics of the semiconductor laser.

According to the method of manufacturing a semiconductor device of one aspect of the invention, the base having the laser chip mounted thereon is irradiated with the plasma, and therefore the ion cleaning effect causes the removal of the adherent deposited on the substrate of the laser chip, the electrodes thereof, the edge thereof, or the like. Moreover, the overall base is irradiated with the plasma after the mounting of the laser chip on the base, and therefore it is possible to exterminate the adherent from the overall system of the base including the laser chip and the heat sink and thus completely break off contact of the laser chip with the foreign material on the edge. Accordingly, this arrangement allows preventing the occurrence of chemical reaction between the component of the adherent and laser light during the operation of the semiconductor laser, thereby preventing the deposition of a material on the laser light emitting edge due to the photo CVD effect. This allows preventing the absorption of laser light by the deposited material and variation in the reflectance of the laser light emitting edge, thus avoiding abnormal variation in the operating current of the semiconductor laser, and thereby achieving an improvement in the longevity characteristics of the semiconductor laser.

According to the method of manufacturing a semiconductor device of another aspect of the invention, the method includes the step of shutting off the base having the laser chip mounted thereon from the outside, after the step of irradiating the base with the energy beam. Thus, this makes it possible to prevent the entry of an external material capable of reacting with laser light during the operation of the semiconductor laser, after irradiation with the energy beam to remove or deteriorate the adherent. Therefore, the effect of irradiation with the energy beam can be further enhanced.

According to the method of manufacturing a semiconductor device of still another aspect of the invention, the base having the laser chip mounted thereon is irradiated with the plasma in an atmosphere of oxygen. Thus, oxidation by the oxygen radical or the ozone is added to the ion cleaning effect of the plasma, which can further ensure that the adherent is removed.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a semiconductor device including a laser chip and a base having the laser chip mounted thereon, including the step of:
   providing an assembly with the laser chip mounted on the base, the assembly including a wire-bonded wiring; and
   after bonding the wire-bonded wire, irradiating the laser chip and base with an energy beam having a shorter wavelength than an oscillation wavelength of the laser chip to remove adherent from the laser chip and the base.

2. A method of manufacturing a semiconductor device according to claim 1 including the step of:
   sealing the base from the outside, after the step of irradiating the laser chip and the base with the energy beam.

3. A method of manufacturing a semiconductor device according to claim 1, wherein a laser chip having a nitride semiconductor layer is used as the laser chip.

4. A method of manufacturing a semiconductor device according to claim 1, wherein a laser chip having an oscillation wavelength of 550 nm or less is used as the laser chip.

5. A method of manufacturing a semiconductor device according to claim 1, wherein irradiation takes place using laser light or ultraviolet light as the energy beam.

6. A method of manufacturing a semiconductor device including a laser chip, a base, and a wire-bonded wire, the method including the step of:
   after bonding the wire-bonded wire, irradiating the base having the laser chip mounted thereon with plasma.

7. A method of manufacturing a semiconductor device according to claim 6 including the step of:
   sealing the base from the outside, after the step of irradiating the base with the plasma.

8. A method of manufacturing a semiconductor device according to claim 6, wherein a laser chip having a nitride semiconductor layer is used as the laser chip.

9. A method of manufacturing a semiconductor device according to claim 6, wherein a laser chip having an oscillation wavelength of 550 nm or less is used as the laser chip.

10. A method of manufacturing a semiconductor device according to claim 6, wherein the step of irradiating the base with the plasma takes place in an atmosphere of oxygen.

* * * * *